United States Patent
Roodnat et al.

(10) Patent No.: US 10,374,618 B1
(45) Date of Patent: Aug. 6, 2019

(54) FREQUENCY LOCKED LOOP WITH MULTI-BIT SAMPLER

(71) Applicant: Qorvo US, Inc., Greensboro, NC (US)

(72) Inventors: Anton Willem Roodnat, Enspijk (NL); Hans Van Driest, The Hague (NL)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/046,513

(22) Filed: Jul. 26, 2018

Related U.S. Application Data

(60) Provisional application No. 62/650,029, filed on Mar. 29, 2018.

(51) Int. Cl.
| | |
|---|---|
| H03L 7/093 | (2006.01) |
| H03L 7/08 | (2006.01) |
| H03L 7/089 | (2006.01) |
| H03L 7/099 | (2006.01) |

(52) U.S. Cl.
CPC ............ *H03L 7/093* (2013.01); *H03L 7/0802* (2013.01); *H03L 7/0891* (2013.01); *H03L 7/099* (2013.01)

(58) Field of Classification Search
None
See application file for complete search history.

(56) References Cited

U.S. PATENT DOCUMENTS

| | | | |
|---|---|---|---|
| 3,543,172 A | 11/1970 | Seppeler | |
| 5,343,169 A | 8/1994 | Debaty | |
| 5,995,539 A | 11/1999 | Miller | |
| 5,999,561 A | 12/1999 | Naden et al. | |
| 6,614,866 B2 | 9/2003 | Hafez et al. | |

(Continued)

FOREIGN PATENT DOCUMENTS

| | | |
|---|---|---|
| JP | 2009182898 | 8/2009 |
| WO | 2004075501 A1 | 9/2004 |
| WO | 2011119022 A1 | 9/2011 |

OTHER PUBLICATIONS

Lu, P., et al., "A 3.6 mW, 90 nm CMOS Gated-Vernier Time-to-Digital Converter With an Equivalent Resolution of 3.2 ps," IEEE Journal of Solid-State Circuits, vol. 47, No. 7, Jul. 2012, pp. 1626-1635.

(Continued)

*Primary Examiner* — Cassandra F Cox
(74) *Attorney, Agent, or Firm* — Withrow & Terranova, P.L.L.C.

(57) ABSTRACT

The present disclosure relates to a frequency locked loop including a frequency detection unit, a local oscillator, and a multi-bit sampler. The frequency detection unit is configured to receive a reference frequency parameter and a sub-sampled frequency parameter, and configured to generate a digital frequency difference, which is a difference indication between the reference frequency parameter and the sub-sampled frequency parameter. The local oscillator is configured to generate an output signal based on the digital frequency difference. The multi-bit sampler is configured to update the sub-sampled frequency parameter by sub-sampling the output signal with N (N>=2) sampling-clocks. The N sampling-clocks have a same sampling frequency and are sequentially offset by an equal time delay between adjacent sampling-clocks. The updated sub-sampled frequency parameter monotonically maps an output frequency of the output signal.

20 Claims, 6 Drawing Sheets

(56) References Cited

U.S. PATENT DOCUMENTS

| | | | |
|---|---|---|---|
| 7,279,988 B1* | 10/2007 | Janesch | H03L 7/08 331/10 |
| 7,411,461 B2 | 8/2008 | Siddall | |
| 7,579,919 B1 | 8/2009 | Cao | |
| 7,750,685 B1 | 7/2010 | Bunch et al. | |
| 8,995,506 B2* | 3/2015 | Roodnat | H03L 7/16 375/219 |
| 9,166,602 B2* | 10/2015 | Van Driest | H03L 7/091 |
| 2005/0057387 A1 | 3/2005 | Janakiraman et al. | |
| 2006/0209986 A1 | 9/2006 | Jensen et al. | |
| 2006/0223454 A1 | 10/2006 | Westwick et al. | |
| 2007/0035345 A1 | 2/2007 | Siddall | |
| 2007/0213019 A1 | 9/2007 | Devries et al. | |
| 2009/0296855 A1 | 12/2009 | Kitamura et al. | |
| 2011/0109321 A1 | 5/2011 | Kawabata et al. | |
| 2013/0005276 A1 | 1/2013 | Van Driest | |

OTHER PUBLICATIONS

Nuyts, P. A. J., et al., "A Fully Digital Delay Line Based GHz Range Multimode Transmitter Front-End in 65-nm CMOS," IEEE Journal of Solid-State Circuits, vol. 47, No. 7, Jul. 2012, pp. 1681-1692.

Staszewski, R. B., et al., "All-Digital TX Frequency Synthesizer and Discrete-Time Receiver for Bluetooth Radio in 130-nm CMOS," IEEE Journal of Solid-State Circuits, vol. 39, No. 12, Dec. 2004, pp. 2278-2291.

Non-Final Office Action for U.S. Appl. No. 13/636,350, dated Dec. 19, 2014, 15 pages.

Notice of Allowance for U.S. Appl. No. 13/636,350, dated Jun. 23, 2015, 7 pages.

International Search Report for International Patent Application No. PCT/NL2010/050150, dated Dec. 17, 2010, 4 pages.

Van Den Berg, Leendert, et al., "An Alias-Locked Loop Frequency Synthesis Architecture," International Symposium on Circuits and Systems, May 2008, IEEE, pp. 1536-1539.

Examination Report for European Patent Application No. 10712587A, dated Apr. 8, 2014, 5 pages.

Notification of Reasons for Refusal for Japanese Patent Application No. 2013-501206, dated Feb. 19, 2014, 8 pages.

Decision of Refusal for Japanese Patent Application No. 2013-501206, dated Dec. 11, 2014, 4 pages.

International Preliminary Report on Patentability for PCT/NL20101050150, dated Oct. 4, 2012, 7 pages.

* cited by examiner

PHASE REPRESENTATION

TIME REPRESENTATION

FREQUENCY LOCKED LOOP WITH MULTI-BIT SAMPLER

RELATED APPLICATIONS

This application claims the benefit of provisional patent application Ser. No. 62/650,029, filed Mar. 29, 2018, the disclosure of which is hereby incorporated herein by reference in its entirety.

FIELD OF THE DISCLOSURE

The present disclosure relates to a frequency locked loop, and more particularly to a frequency locked loop with a multi-bit sampler that has low power consumption.

BACKGROUND

Phase-locked loop (PLL) based frequency synthesizers are widely utilized in radio frequency (RF) communication devices, such as an RF transmitter. The PLL based frequency synthesizer normally includes a phase detector, a local oscillator (LO), and a frequency divider. An output signal provided by the LO is fed through the frequency divider back to the phase detector to be compared to a reference signal. Once the output signal of the LO is locked with the reference signal in phase and frequency, the frequency synthesizer is settled.

Alternatively, frequency synthesizers may be built using a frequency locked loop (FLL), which includes a frequency detector, an LO, and a frequency divider. An output signal provided by the LO is fed through the frequency divider back to the frequency detector to be compared to a reference signal. Once the output signal of the LO is locked with the reference signal in frequency (may or may not be in phase), the frequency synthesizer is settled. Since the FLL based frequency synthesizers only require a frequency lock, the FLL based frequency synthesizers may have a shorter settle time compared to the PLL based frequency synthesizers. Further, if the frequency difference between the output signal and the reference signal is higher than a certain level, the PLL based frequency synthesizers may fail to settle.

Typically, the frequency of the output signal of the LO is at a GHz-level, thus the frequency divider, which is used to reduce the frequency of the output signal of the LO in the feedback loop, requires a GHz-level clock. In addition, if the frequency of the reference signal is much lower than the frequency of the output signal of the LO, the frequency divider will be a high-power consumption component.

Accordingly, there remains a need for an improved frequency synthesizer design, which is able to utilize the fast settle time of the FLL and reduce the power consumption of the final product without introducing significant noise in the output signal.

SUMMARY

The present disclosure relates to a frequency locked loop (FLL) with a multi-bit sampler. The disclosed FLL includes a frequency detection unit, a local oscillator (LO), and a multi-bit sampler. The frequency detection unit is configured to receive a reference frequency parameter and a sub-sampled frequency parameter, and configured to generate a digital frequency difference. Herein, the digital frequency difference is a difference indication between the reference frequency parameter and the sub-sampled frequency parameter. The LO is configured to generate an output signal based on the digital frequency difference. The multi-bit sampler is configured to update the sub-sampled frequency parameter applied to the frequency detection unit by sub-sampling the output signal with N (N>=2) sampling-clocks. The N sampling-clocks have a same sampling frequency and are sequentially offset by an equal time delay between adjacent sampling-clocks. The updated sub-sampled frequency parameter monotonically maps an output frequency of the output signal.

In one embodiment of the FLL, the multi-bit sampler includes N sub-sampling units. Herein, each of the N sub-sampling units is clocked by a corresponding one of the N sampling-clocks and configured to provide a sub-sampling output based on the output signal from the LO.

In one embodiment of the FLL, each of the N sub-sampling units is a one-bit unit and the sub-sampling output is a one-bit signal.

In one embodiment of the FLL, the multi-bit sampler further includes a phase coder and a phase to frequency converter. Herein, the phase coder is configured to receive the sub-sampling output from each of the N sub-sampling units and configured to provide a phase word, which represents an initial phase state of the output signal. The phase to frequency converter is configured to receive the phase word and configured to provide the sub-sampled frequency parameter.

In one embodiment of the FLL, a transfer function of the phase to frequency converter is achieved by differentiation of the phase-word combined with a modulo operation.

In one embodiment of the FLL, the output signal has a period $T_{OUT}$, and the time delay between the adjacent sampling-clocks equals to $T_{OUT}/N$. Herein, a phase-resolution of the multi-bit sampler is 360/N, and the phase-word has a number of bits equal to log 2N.

In one embodiment of the FLL, a duty cycle of the output signal is about 50%, the output signal has a period $T_{OUT}$, and the time delay between the adjacent sampling-clocks equals to $T_{OUT}/2N$. Herein, a phase-resolution of the multi-bit sampler is 180/N, and the phase-word has a number of bits equal to log 2N+1. The transfer function of the phase to frequency converter is implemented as $H(z)=\text{mod}(1-z^{-1}, 2N)$.

In one embodiment of the FLL, the LO is a voltage controlled oscillator. The disclosed FLL further includes a digital filter, a digital-to-analog converter (DAC), and a loop filter. The digital filter is configured to attenuate frequency noise associated with the digital frequency difference and provide a filtered digital frequency difference to the DAC. The DAC is configured to provide an analog parameter based on the filtered digital frequency difference. And the loop filter is configured to receive the analog parameter, smooth the analog parameter, and provide a voltage control signal to the LO. Herein, the LO is configured to generate the output signal based on the voltage control signal.

In one embodiment of the FLL, the digital-to-analog converter is a delta-sigma modulator, which includes a charge pump. As such, the analog parameter provided by the DAC is current.

In one embodiment of the FLL, the LO is a digitally controlled oscillator (DCO). The disclosed FLL further includes a loop filter between the frequency detection unit and the LO. The loop filter is configured to receive the digital frequency difference and provide a digital control signal to the LO.

In one embodiment of the FLL, the sampling frequency of the N sampling-clocks is at least 10 times slower than the output frequency of the output signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
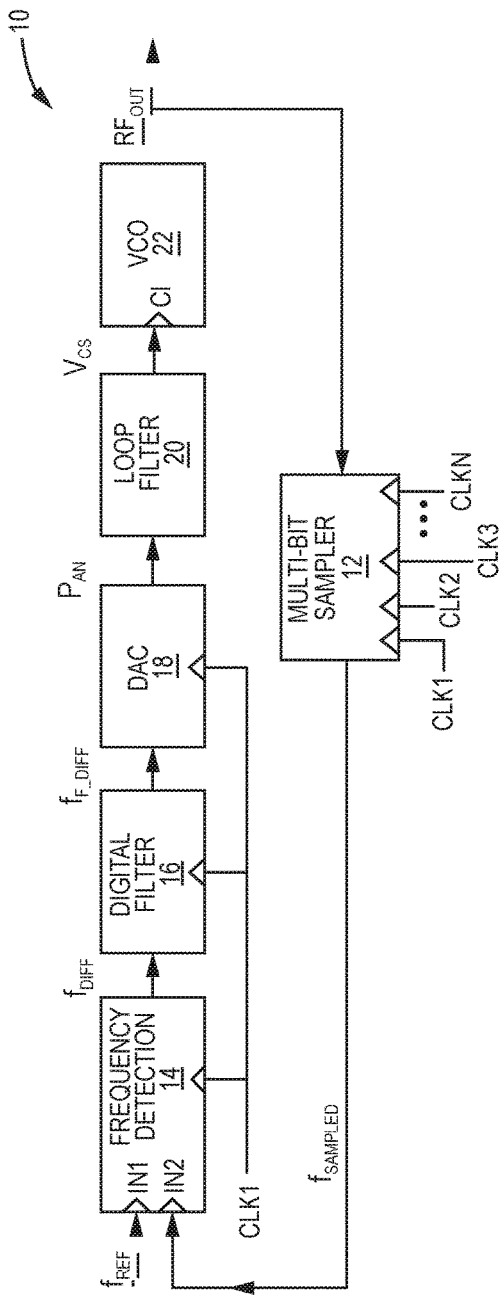
FIG. 1 shows an exemplary frequency locked loop according to one embodiment of the present disclosure.

It will be understood that for clear illustrations, FIGS. 1-7 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a frequency locked loop (FLL) with a multi-bit sampler. FIG. 1 shows an exemplary FLL 10 according to one embodiment of the present disclosure. The FLL 10 is configured to receive a reference frequency parameter $f_{REF}$, which represents a digital frequency value, and provide a radio frequency (RF) output signal $RF_{OUT}$ with an output frequency $f_{OUT}$. Herein, the reference frequency parameter $f_{REF}$ is constant and associated with a desired output frequency of the RF output signal $RF_{OUT}$. The FLL 10 includes a feedback loop with the following components: a multi-bit sampler 12, a frequency detection unit 14, a digital filter 16, a digital to analog converter (DAC) 18, a loop filter 20, and a voltage-controlled oscillator (VCO) 22.

In detail, the RF output signal $RF_{OUT}$ is fed to the multi-bit sampler 12 and is sub-sampled by the multi-bit sampler 12 with a number of sampling-clocks CLK1~CLKN. The sampling-clocks CLK1~CLKN have a same sampling frequency $f_{SAMPLING}$ and are sequentially offset by an equal time delay $\Delta T$ between adjacent sampling-clocks. For example, the second sampling clock CLK2 is delayed by $\nabla T$ with respect to the first sampling clock CLK1, the third sampling clock CLK3 is delayed by $\nabla T$ with respect to the second sampling clock CLK2, and so on. Herein, the sampling frequency $f_{SAMPLING}$ may be much slower (at least 10 times slower) than the output frequency $f_{OUT}$ of the RF output signal $RF_{OUT}$. The multi-bit sampler 12 is configured to generate a sub-sampled frequency parameter $f_{SAMPLED}$, which monotonically maps the output frequency $f_{OUT}$ of the RF output signal $RF_{OUT}$ (more details are described in the following paragraphs).

The frequency detection unit 14 includes a first input IN1 for receiving the reference frequency parameter $f_{REF}$ and a second input IN2 for receiving the sub-sampled frequency parameter $f_{SAMPLED}$. The frequency detection unit 14 is configured to generate a digital frequency difference $f_{DIFF}$, which is an indication of a frequency difference between the desired reference frequency parameter $f_{REF}$ and the output frequency $f_{OUT}$ of the RF output signal $RF_{OUT}$. In one embodiment, the frequency detection unit 14 may be a digital subtractor, which is configured to subtract the sampled frequency parameter $f_{SAMPLED}$ from the reference frequency parameter $f_{REF}$. It is clear to those skilled in the art that if the sub-sampled frequency parameter $f_{SAMPLED}$ is negative, the frequency detection unit 14 may be an adder instead of a subtractor to provide the same functionality. Once the FLL 10 is locked, the output frequency $f_{OUT}$ of the RF output signal $RF_{OUT}$ achieves a desired value corresponding to the reference frequency parameter $f_{REF}$.

The digital filter 16 may be a low-pass filter and configured to attenuate high frequency noise associated with the digital frequency difference $f_{DIFF}$ and provide a filtered digital frequency difference $f_{F\text{-}DIFF}$ to the DAC 18. The DAC 18 is configured to convert the filtered digital frequency difference $f_{F\text{-}DIFF}$ into an analog parameter $P_{AN}$. In one embodiment the DAC 18 may be a delta sigma modulator (DSM), which may include a charge pump (not shown) so that a charge (related to filtered digital frequency difference $f_{F\text{-}DIFF}$) may be pumped into the loop filter 20. Herein, the analog parameter $P_{AN}$ is a current. The frequency detection unit 14, the digital filter 16, and the DAC 18 maybe clocked by the same first sampling-clock CLK1. In some applications, there is no digital filter 16 between the frequency detection unit 14 and the DAC 18. As such, the DAC 18 is configured to convert the digital frequency difference $f_{DIFF}$ into the analog parameter $P_{AN}$.

The loop filter 20 may include electronic components such as resistors and capacitors, and is configured to smooth the analog parameter $P_{AN}$ and provide a voltage control signal $V_{CS}$ to a control input CI of the VCO 22. The loop filter 20 may be a low-pass filter. In one embodiment, the loop filter 20 may be a 2nd order low-pass filter with an out-of-band attenuation with a roll-off of 12 dB per octave.

The VCO 22 is configured to receive the voltage control signal $V_{CS}$ to update the RF output signal $RF_{OUT}$ with an updated output frequency $f_{OUT}$. The updated output frequency $f_{OUT}$ is a function of the voltage control signal $V_{CS}$. The updated RF output signal $RF_{OUT}$ is then applied to the multi-bit sampler 12 to update the sub-sampled frequency parameter $f_{SAMPLED}$ that is applied to the frequency detection unit 14. The updated sub-sampled frequency parameter $f_{SAMPLED}$ is monotonically mapping the updated output frequency $f_{OUT}$.

Figure 2:
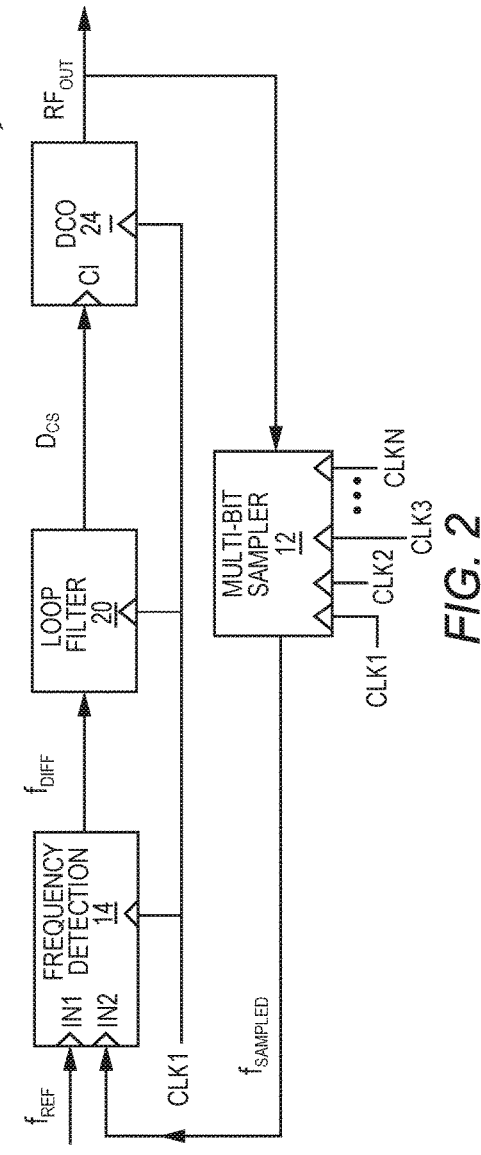
FIG. 2 shows an alternative frequency locked loop according to one embodiment of the present disclosure.

FIG. 2 shows an alternative FLL 10A according to one embodiment of the present disclosure. Similar to the FLL 10, the alternative FLL 10A is configured to receive the reference frequency parameter $f_{REF}$ and provide the RF output signal $RF_{OUT}$ with the output frequency $f_{OUT}$. A major difference between the FLL 10 and the alternative FLL 10A is that the alternative FLL 10A utilizes a digitally controlled oscillator (DCO) 24 instead of the VCO 22 to generate the RF output signal $RF_{OUT}$. Since the DCO 24 is controlled by a digital signal, the alternative FLL 10A does not need the DAC 18 to convert a digital signal to an analog signal, and does not need the digital filter 16 used before the DAC 18. The alternative FLL 10A includes the multi-bit sampler 12, the frequency detection unit 14, the loop filter 20, and the DCO 24. Herein, the loop filter 20 may be directly coupled to the frequency detection unit 14 and configured to provide a digital control signal Dcs to the DCO 24, which is used to generate the RF output signal $RF_{OUT}$. The multi-bit sampler 12 still utilizes the sampling-clocks CLK1~CLKN to sub-sample the RF output signal $RF_{OUT}$. The frequency detection unit 14, the loop filter 20, and the DCO 24 may be clocked by the same first sampling-clock CLK1.

Figure 3:
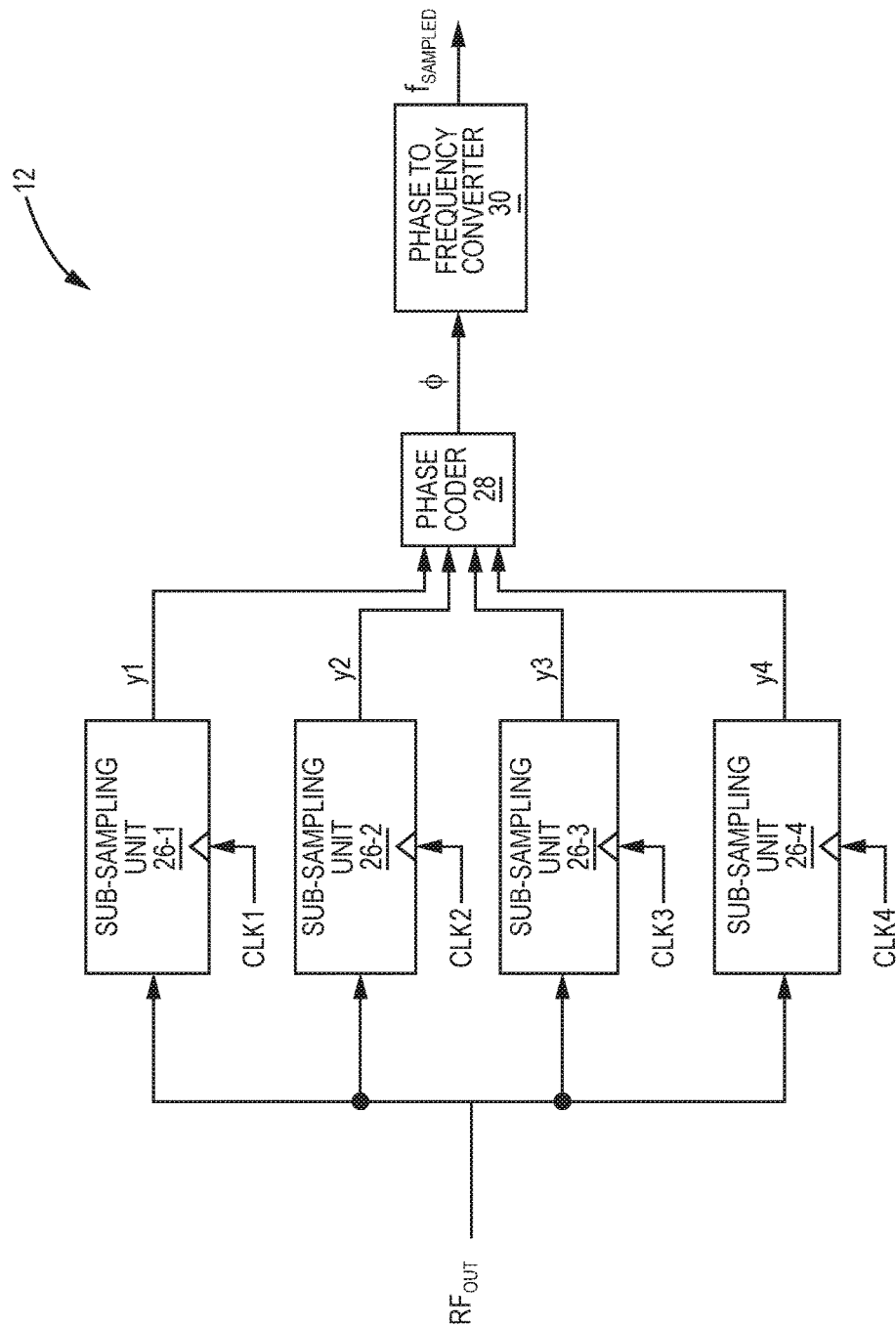
FIG. 3 shows details of an exemplary multi-bit sampler of the frequency locked loop illustrated in FIG. 1.

FIG. 3 shows details of an exemplary multi-bit sampler 12 of the FLL 10 illustrated in FIG. 1. It is clear to those skilled in the art that the multi-bit sampler 12 shown in FIG. 3 may also be applied to the alternative FLL 10A illustrated in FIG. 2. The multi-bit sampler 12 includes a number of sub-sampling units 26, a phase coder 28, and a phase to frequency converter 30. In different applications, the multi-bit sampler 12 may include a different number of the sub-sampling units 26. It is commonly known that sub-sampling may enable reduced power consumption but it may also introduce quantization noise, which for some frequencies may lead to spurs due to repeating bit-patterns. Multiple sub-sampling units 26 instead of one sub-sampling unit 26 will reduce the quantization noise, while still keeping the low power consumption. For clarification and simplification, each sub-sampling unit 26 may be a one-bit unit, and the multi-bit sampler 12 includes four one-bit sub-sampling units 26-1~26-4 in the following examples.

The RF output signal $RF_{OUT}$ is applied to each of the sub-sampling units 26-1~26-4. The first sub-sampling unit 26-1 is clocked by the first sampling-clock CLK1 and provides a first sub-sampling output y1. The second sub-sampling unit 26-2 is clocked by the second sampling-clock CLK2 and provides a second sub-sampling output y2. The third sub-sampling unit 26-3 is clocked by the third sampling-clock CLK3 and provides a third sub-sampling output y3. The fourth sub-sampling unit 26-4 is clocked by the fourth sampling-clock CLK4 and provides a fourth sub-sampling output y4. Herein, the sampling frequency $f_{SAMPLING}$ of the sampling-clock CLK1~CLK4 is much slower (at least 10 times slower) than the output frequency $f_{OUT}$ of the RF output signal $RF_{OUT}$.

Each of the sub-sampling outputs y1~y4 may be a one-bit signal. The phase coder 28 is configured to receive the first, second, third and fourth sub-sampling outputs y1~y4 and configured to provide a phase word $\phi$ that represents an initial phase state of the RF output signal $RF_{OUT}$. The phase to frequency converter 30 is configured to receive the phase word $\phi$ and provide a sub-sampled frequency parameter $f_{SAMPLED}$. A transfer function of the phase to frequency converter 30 may be achieved by differentiation of the phase-word $\phi$ combined with a modulo operation.

Figure 4:
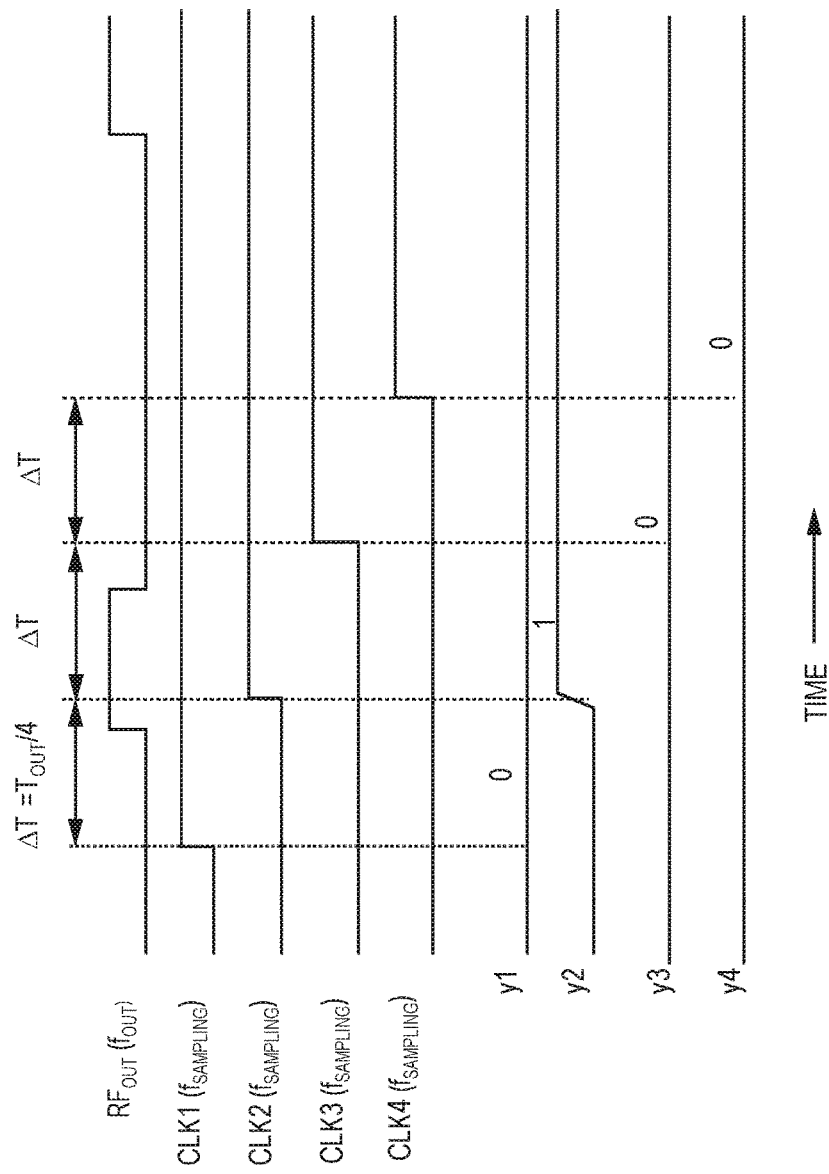
FIG. 4 shows clock timing and sampling operations of the multi-bit sampler illustrated in FIG. 3.

FIG. 4 shows clock timing and sampling operations of the multi-bit sampler illustrated in FIG. 3. Herein, if the RF output signal $RF_{OUT}$ has a period $T_{OUT}$ ($T_{OUT}=1/f_{OUT}$) and the duty cycle of the RF output signal $RF_{OUT}$ is arbitrary, one entire period $T_{OUT}$ is evenly sampled. Each sub-sampling unit 26 of the multi-bit sampler 12 is configured to sub-sample (with the same sampling frequency $f_{SAMPLING}$) the RF output signal $RF_{OUT}$ (at a corresponding dashed line) within one entire period $T_{OUT}$. The sampling-clocks CLK1~CLKN are sequentially offset by an equal time delay $\Delta T = T_{OUT}/N$ (N is equal to the number of the sub-sampling units 26). In this example, the sampling-clocks CLK1~CLK4 are sequentially offset by a same time delay $\Delta T = T_{OUT}/4$.

Figure 5:
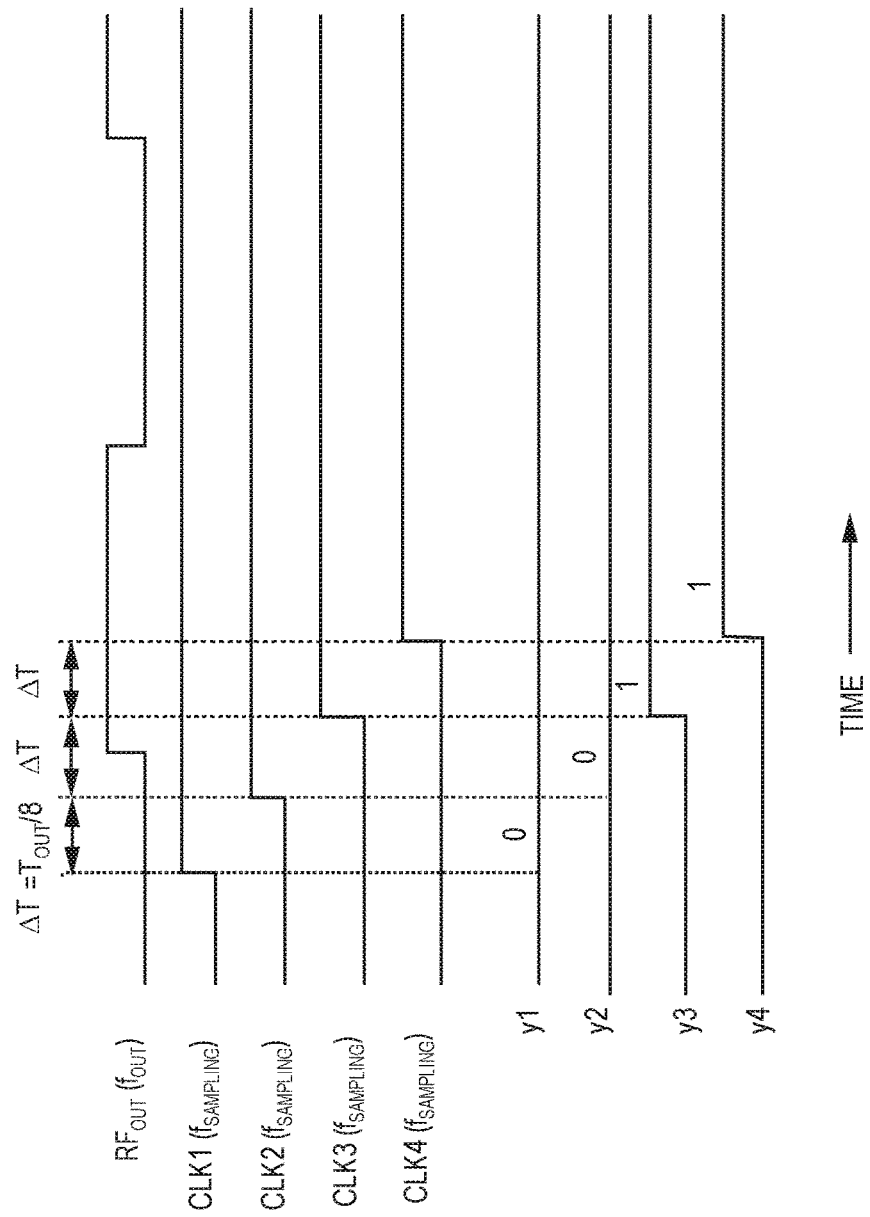
FIG. 5 shows alternative clock timing and sampling operations of the multi-bit sampler illustrated in FIG. 3.

In a case where the RF output signal $RF_{OUT}$ has a duty-cycle about 50% (between 45%-55%), then it may be sufficient to sample only half of the period $T_{OUT}$ of the RF output signal $RF_{OUT}$, because the other half period $T_{OUT}$ of the RF output signal $RF_{OUT}$ will result in the complementary sampler output and not add more information. As shown in FIG. 5, when the RF output signal $RF_{OUT}$ has a duty-cycle close to 50%, each sub-sampling unit 26 of the multi-bit sampler 12 is configured to sub-sample (with the sampling frequency $f_{SAMPLING}$) the RF output signal $RF_{OUT}$ (at a corresponding dashed line) within a half period $T_{OUT}/2$. The sampling-clocks CLK1~CLK4 are sequentially offset by an equal time delay $\Delta T=(T_{OUT}/2)/4=T_{OUT}/8$. Herein, each of the sub-sampling outputs y1~y4 has a digital value "1" or "0" depending on the value of the RF output signal $RF_{OUT}$ when the corresponding sampling-clock comes. Different "1" and "0" combinations of the sub-sampling outputs y1~y4 are corresponding to different initial phase states of the RF output signal $RF_{OUT}$.

Figure 6B:
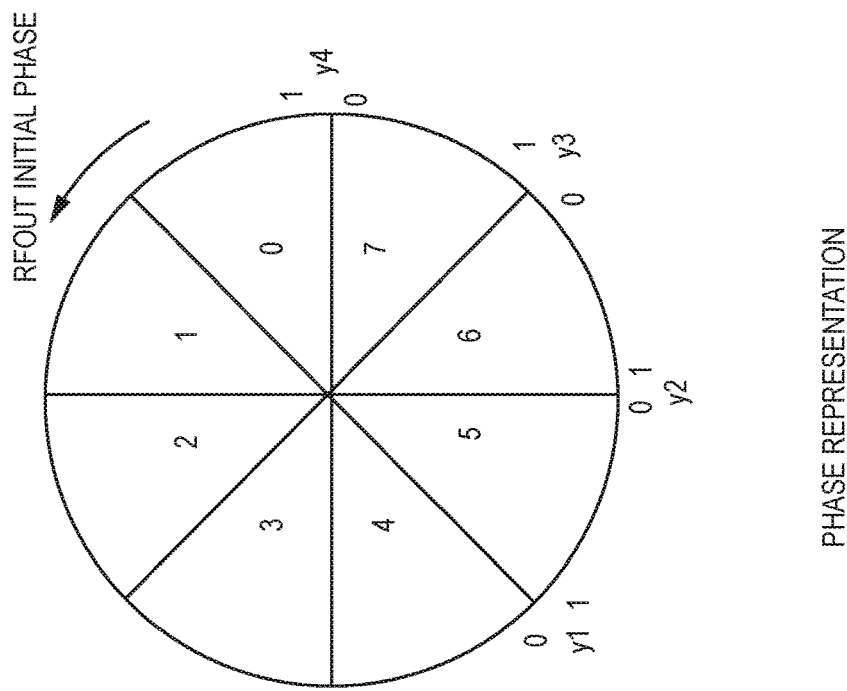
FIGS. 6A and 6B show relationships between sub-sampling outputs and a phase word that represents an initial phase state of an RF output signal.
Figure 6A:
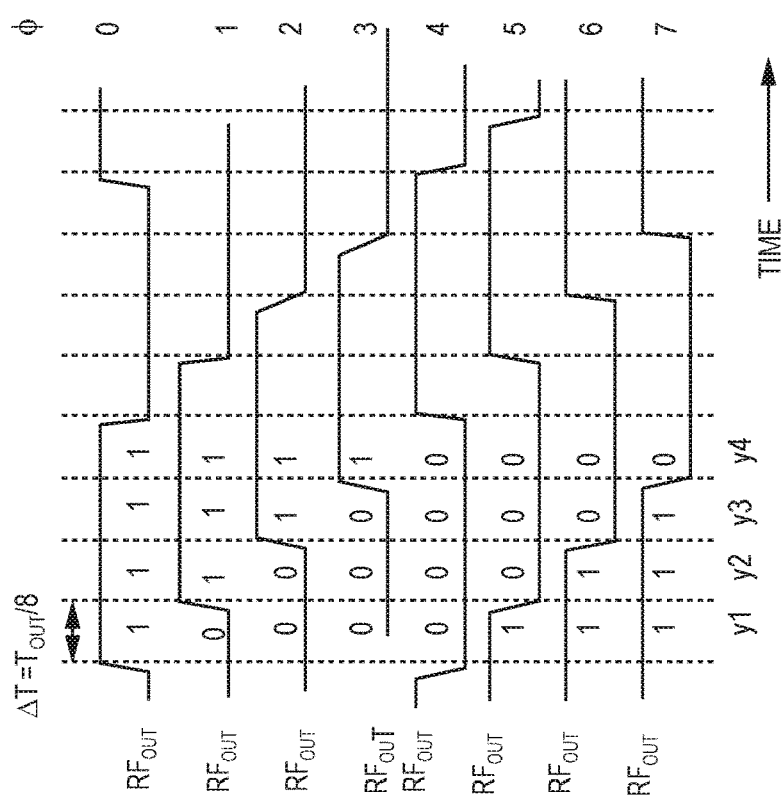

FIGS. 6A and 6B show relationships between the sub-sampling outputs y1~y4 and the phase word φ that represents the initial phase state of the RF output signal $RF_{OUT}$. Herein, the sampling-clocks CLK1~CLK4 are sequentially offset by an equal time delay $\Delta T=T_{OUT}/8$. As illustrated in a time domain in FIG. 6A, when a combination of the sub-sampling outputs y1~y4 is "1111", the phase word φ is "0" and represents the RF output signal $RF_{OUT}$ having a first initial phase state; when a combination of the sub-sampling outputs y1~y4 is "0111", the phase word φ is "1" and represents the RF output signal $RF_{OUT}$ having a second initial phase state; when a combination of the sub-sampling outputs y1~y4 is "0011", the phase word φ is "2" and represents the RF output signal $RF_{OUT}$ having a third initial phase state; when a combination of the sub-sampling outputs y1~y4 is "0001", the phase word φ is "3" and represents the RF output signal $RF_{OUT}$ having a fourth initial phase state; when a combination of the sub-sampling outputs y1~y4 is "0000", the phase word φ is "4" and represents the RF output signal $RF_{OUT}$ having a fifth initial phase state; when a combination of the sub-sampling outputs y1~y4 is "1000", the phase word φ is "5" and represents the RF output signal $RF_{OUT}$ having a sixth initial phase state; when a combination of the sub-sampling outputs y1~y4 is "1100", the phase word φ is "6" and represents the RF output signal $RF_{OUT}$ having a seventh initial phase state; and when a combination of the sub-sampling outputs y1~y4 is "1110", the phase word φ is "7" and represents the RF output signal $RF_{OUT}$ having an eighth initial phase state. Herein, the combination of the sub-sampling outputs y1~y4 may represent eight different initial phase states of the RF output signal $RF_{OUT}$. Therefore, the phase resolution of the multi-bit sampler 12 is 45 degrees herein. In general, when the duty-cycle of the RF output signal $RF_{OUT}$ is close to 50% and the multi-bit sampler 12 has N sub-sampling units 26, the phase resolution of the multi-bit sampler 12 is $\Delta\varphi=360/2N=180/N$ degrees. Furthermore, the number of bits of the phase word φ is log 2N+1, so for this example it is three. In another embodiment, if the duty-cycle of the RF output signal $RF_{OUT}$ is not close to 50%, and the sampling-clocks CLK1~CLKN of the multi-bit sampler 12 are sequentially offset by an equal time delay $\Delta T=T_{OUT}/N$ (as shown in FIG. 4), the phase resolution of the multi-bit sampler 12 is $\Delta\varphi=360/N$ degrees. Furthermore, the number of bits of the phase word φ is log 2N.

As illustrated in a phase domain in FIG. 6B, when the RF output signal $RF_{OUT}$ has the first initial phase state (the phase word φ is "0"), the initial phase of the RF output signal $RF_{OUT}$ is between 1° and 45°; when the RF output signal $RF_{OUT}$ has the second initial phase state (the phase word φ is "1"), the initial phase of the RF output signal $RF_{OUT}$ is between 46° and 90°; when the RF output signal $RF_{OUT}$ has the third initial phase state (the phase word φ is "2"), the initial phase of the RF output signal $RF_{OUT}$ is between 91° and 135°; when the RF output signal $RF_{OUT}$ has the fourth initial phase state (the phase word φ is "3"), the initial phase of the RF output signal $RF_{OUT}$ is between 136° and 180°; when the RF output signal $RF_{OUT}$ has the fifth initial phase state (the phase word φ is "4"), the initial phase of the RF output signal $RF_{OUT}$ is between 181° and 225°; when the RF output signal $RF_{OUT}$ has the sixth initial phase state (the phase word φ is "5"), the initial phase of the RF output signal $RF_{OUT}$ is between 226° and 270°; when the RF output signal $RF_{OUT}$ has the seventh initial phase state (the phase word φ is "6"), the initial phase of the RF output signal $RF_{OUT}$ is between 271° and 315°; and when the RF output signal $RF_{OUT}$ has the eighth initial phase state (the phase word φ is "7"), the initial phase of the RF output signal $RF_{OUT}$ is between 316° and 360°.

In addition, when the first sub-sampling output y1 is "1", the phase word φ is "0", "5", "6", or "7", which represents the RF output signal $RF_{OUT}$ having the first, sixth, seventh, or eighth initial phase state, respectively. When the first sub-sampling output y1 is "0", the phase word φ is "1", "2", "3", or "4", which represents the RF output signal $RF_{OUT}$ having the second, third, fourth, or fifth initial phase state, respectively. Similarly, when the second sub-sampling output y2 is "1", the phase word φ is "0", "1", "6", or "7", which represents the RF output signal $RF_{OUT}$ having the first, second, seventh, or eighth initial phase state, respectively. When the second sub-sampling output y2 is "0", the phase word φ is "2", "3", "4", or "5", which represents the RF output signal $RF_{OUT}$ having the third, fourth, fifth or sixth initial phase state, respectively. When the third sub-sampling output y3 is "1", the phase word φ is "0", "1", "2", or "7", which represents the RF output signal $RF_{OUT}$ having the first, second, third, or eighth initial phase state, respectively. When the third sub-sampling output y3 is "0", the phase word φ is "3", "4", "5", or "6", which represents the RF output signal $RF_{OUT}$ having the fourth, fifth, sixth, or seventh initial phase state, respectively. When the fourth sub-sampling output y4 is "1", the phase word φ is "0", "1", "2", or "3", which represents the RF output signal $RF_{OUT}$ having the first, second, third, or fourth initial phase state, respectively. When the fourth sub-sampling output y4 is "0", the phase word φ is "4", "5", "6", or "7", which represents the RF output signal RFOUT having the fifth, sixth, seventh, or eighth initial phase state, respectively.

It is clear to notice that although the sub-sampling units 26-1~26-4 utilize the sampling-clocks CLK1~CLK4, which have the sampling frequency $f_{SAMPLING}$ much slower than the output frequency $f_{OUT}$ of the RF output signal $RF_{OUT}$ (for instance, $f_{SAMPLING}$ is 32 MHz and $f_{OUT}$ is about 2.4 GHz), the combination of the sub-sampling outputs y1~y4 from the sub-sampling units 26-1~26-4 are capable of distinguishing different initial phase states of the RF output signal $RF_{OUT}$. It is because the time delay $\Delta T$ between adjacent sampling-clocks (between CLK1 and CLK2, between CLK2 and CLK3, and between CLK 3 and CLK 4) is very short and is a fraction of the period $T_{OUT}$ of the RF output signal $RF_{OUT}$. In some applications, an error dT may appear in the time delay $\Delta T$, for instance due to a change in the output frequency $f_{OUT}$ or a change in duty-cycle of the RF output signal $RF_{OUT}$. The error dT may be acceptable as long as it is smaller than approximately $\Delta T/4$. In a case where the RF output signal $RF_{OUT}$ has the output frequency $f_{OUT}$ about 2.4 GHz, 50% duty-cycle and N=4, then the acceptable error dT in the time delay $\Delta T$ is approximately $T_{OUT}/(4*2N)=13$ ps.

Figure 7:
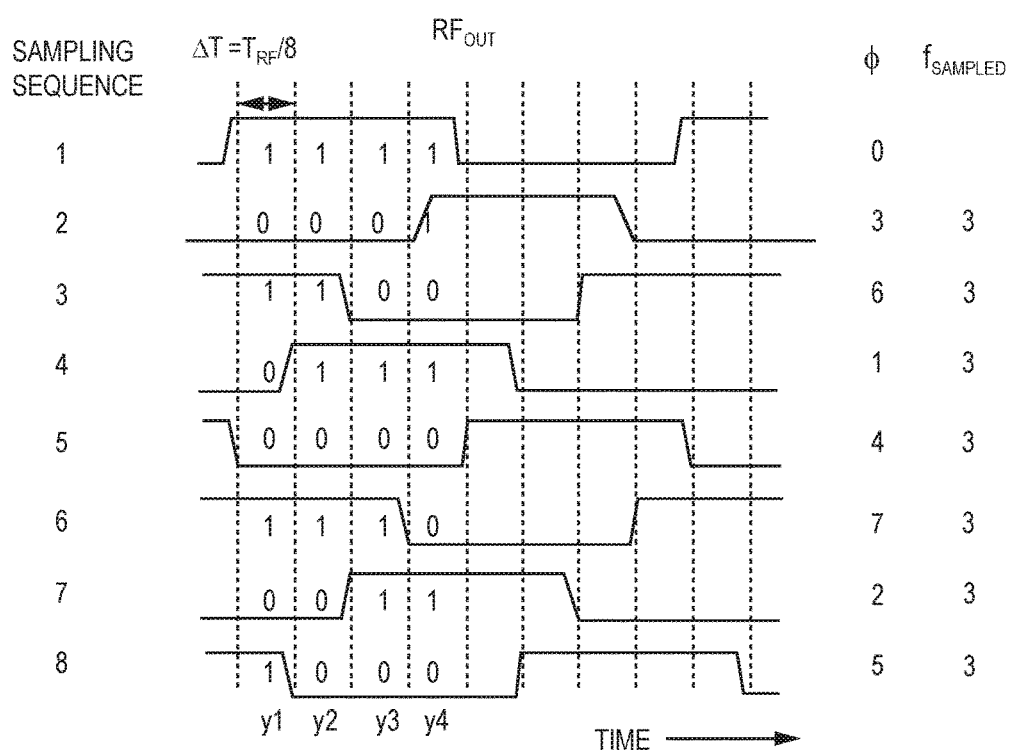
FIG. 7 shows conversions from the phase word to a sub-sampled frequency parameter that is monotonically mapping the output frequency of the RF output signal.

FIG. 7 shows conversions from the phase word φ to the sub-sampled frequency parameter $f_{SAMPLED}$ through the phase to frequency converter 30 illustrated in FIG. 3. The transfer function of the phase to frequency converter 30 may be achieved by differentiation of the phase-word φ combined with a modulo operation. In a case where the RF output signal $RF_{OUT}$ has about a 50% duty-cycle, a possible implementation of the transfer function of the phase to frequency converter 30 is H(z)=mod (1−z−1, 2N), in which N is equal to the number of the sub-sampling units 26. Herein, mod (x,y) is the modulo operation wrapping around y. For N=4, the transfer function is H(z)=mod $(1-z^{-1}, 8)$.

In FIG. 7, the combination of the sub-sampling outputs y1~y4 and the phase word φ are illustrated in a sampling sequence (vertically). For instance, if the current combination of the sub-sampling outputs y1~y4 is "0001" and the corresponding phase word φ is "3", the previous combination of the sub-sampling outputs y1~y4 is "1111" and the phase word φ is "0", and the next combination of the sub-sampling outputs y1~y4 is "1100" and the phase word φ is "6". Based on the transfer function being H(z)=mod (1−z−1, 8), the sub-sampled frequency parameter $f_{SAMPLED}$ is calculated to be "3". It is clear to observe that once the output frequency $f_{OUT}$ of the RF output signal $RF_{OUT}$ is fixed (no matter the initial phase state of the RF output signal $RF_{OUT}$), the sub-sampled frequency parameter $f_{SAMPLED}$ is fixed. The sub-sampled frequency parameter $f_{SAMPLED}$ and the output frequency $f_{OUT}$ of the RF output signal $RF_{OUT}$ have a monotonic relationship:

$$f_{OUT}=(M+f_{SAMPLED}/2N)*f_{SAMPLING}$$

in which M may be any integer depending on target applications. For instance, $f_{SAMPLING}$=32 MHz, M=75, N=4, $f_{SAMPLED}$=3 would result in $f_{OUT}$=2412 MHz.

Those skilled in the art will recognize improvements and modifications to the preferred embodiments of the present disclosure. All such improvements and modifications are considered within the scope of the concepts disclosed herein and the claims that follow.

What is claimed is:

1. A frequency locked loop (FLL) comprising:
    a frequency detection unit, which is configured to receive a reference frequency parameter and a sub-sampled frequency parameter, and to generate a digital frequency difference, wherein the digital frequency difference is a difference indication between the reference frequency parameter and the sub-sampled frequency parameter;
    a local oscillator (LO) configured to generate an output signal based on the digital frequency difference; and
    a multi-bit sampler configured to update the sub-sampled frequency parameter applied to the frequency detection unit by sub-sampling the output signal with N sampling-clocks, wherein:
        N is greater than or equal to 2;
        the N sampling-clocks have a same sampling frequency and are sequentially offset by an equal time delay between adjacent sampling-clocks; and
        the updated sub-sampled frequency parameter monotonically maps an output frequency of the output signal.

2. The FLL of claim 1 wherein the multi-bit sampler comprises N sub-sampling units, wherein each of the N sub-sampling units is clocked by a corresponding one of the N sampling-clocks and configured to provide a sub-sampling output based on the output signal from the LO.

3. The FLL of claim 2 wherein each of the N sub-sampling units is a one-bit unit and the sub-sampling output is a one-bit signal.

4. The FLL of claim 2 wherein the multi-bit sampler further comprises a phase coder and a phase to frequency converter, wherein:
    the phase coder is configured to receive the sub-sampling output from each of the N sub-sampling units and provide a phase word, which represents an initial phase state of the output signal; and
    the phase to frequency converter is configured to receive the phase word and provide the sub-sampled frequency parameter.

5. The FLL of claim 4 wherein a transfer function of the phase to frequency converter is achieved by differentiation of the phase-word combined with a modulo operation.

6. The FLL of claim 2 wherein the output signal has a period $T_{OUT}$, and the time delay between the adjacent sampling-clocks equals to $T_{OUT}$/N.

7. The FLL of claim 6 wherein a phase-resolution of the multi-bit sampler is 360/N.

8. The FLL of claim 6 wherein the phase-word has a number of bits equal to $\log_2 N$.

9. The FLL of claim 2 wherein:
    a duty cycle of the output signal is about 50%; and
    the output signal has a period $T_{OUT}$ and the time delay between the adjacent sampling-clocks is equal to $T_{OUT}$/2N.

10. The FLL of claim 9 wherein a phase-resolution of the multi-bit sampler is 180/N.

11. The FLL of claim 9 wherein the phase-word has a number of bits equal to $\log_2 N+1$.

12. The FLL of claim 9 wherein a transfer function of the phase to frequency converter is implemented as H(z)=mod $(1-z^{-1}, 2N)$.

13. The FLL of claim 1 wherein the LO is a voltage controlled oscillator.

14. The FLL of claim 13 further comprising:
    a digital-to-analog converter (DAC) configured to provide an analog parameter based on the digital frequency difference; and
    a loop filter configured to receive the analog parameter, smooth the analog parameter, and provide a voltage control signal to the LO, wherein the LO is configured to generate the output signal based on the voltage control signal.

15. The FLL of claim 14 further comprising a digital filter between the frequency detection unit and the DAC, wherein the digital filter is configured to attenuate frequency noise associated with the digital frequency difference and provide a filtered digital frequency difference to the DAC.

16. The FLL of claim 14 wherein the digital-to-analog converter is a delta-sigma modulator.

17. The FLL of claim 16 wherein the DAC includes a charge pump, such that the analog parameter provided by the DAC is current.

18. The FLL of claim 1 wherein the LO is a digitally controlled oscillator (DCO).

19. The FLL of claim 18 further comprising a loop filter between the frequency detection unit and the LO, wherein the loop filter is configured to receive the digital frequency difference and provide a digital control signal to the LO.

20. The FLL of claim 1 wherein the sampling frequency of the N sampling-clocks is at least 10 times slower than the output frequency of the output signal.

* * * * *